United States Patent [19]

Locher et al.

[11] Patent Number: 5,398,640
[45] Date of Patent: Mar. 21, 1995

[54] APPARATUS FOR GROWING HOLLOW CRYSTALLINE BODIES FROM THE MELT

[75] Inventors: John W. Locher, Sterling; Joseph E. Madsen, Leominster, both of Mass.

[73] Assignee: Saphikon, Inc., Milford, N.H.

[21] Appl. No.: 24,783

[22] Filed: Mar. 1, 1993

Related U.S. Application Data

[63] Continuation of Ser. No. 722,912, Jun. 28, 1991, abandoned, which is a continuation-in-part of Ser. No. 550,482, Jul. 10, 1990, abandoned.

[51] Int. Cl.$^6$ ............................................. C30B 15/34
[52] U.S. Cl. ......................................... 117/23; 117/25; 117/33; 117/209; 117/210; 117/950
[58] Field of Search .................. 156/608, 617.1, 618.1, 156/620.1, DIG. 61, DIG. 88, DIG. 84; 427/246, 249; 117/23, 25, 33, 209, 210, 950

[56] References Cited

U.S. PATENT DOCUMENTS

| | | | |
|---|---|---|---|
| 3,846,082 | 11/1974 | Labelle et al. | 156/608 |
| 3,915,656 | 10/1975 | Mlavsky et al. | 156/120.1 |
| 3,915,662 | 10/1975 | Labelle et al. | 156/620.1 |
| 3,953,174 | 4/1976 | Labelle | 156/608 |
| 4,323,418 | 4/1982 | Kobayashi | 156/617.1 |
| 4,915,773 | 4/1990 | Kravetsky et al. | 156/617.1 |
| 4,937,053 | 7/1990 | Harvey | 156/617.1 |
| 4,957,713 | 9/1990 | Kravetsky et al. | 156/617.1 |

OTHER PUBLICATIONS

Borodin et al., "Variable Shaping Growth of Refractory Oxide Shaped Crystals", Journal of Crystal Growth, vol. 82 pp. 89–94, 1987.

*Primary Examiner*—Robert Kunemund
*Attorney, Agent, or Firm*—Hayes, Soloway, Hennessey, Grossman & Hage

[57] ABSTRACT

A single crystal dome is formed from a surface of revolution and grown from a liquid material on a linear die surface wettable by the molten material. A seed crystal is supported in a position spaced from an axis of revolution which lies in the plane of the wettable surface, and the seed crystal is rotated around the axis of revolution to generate a curved surface having a predetermined radius of curvature. The seed crystal is supported in a predetermined orientation of one of its axes with respect to the wetted surface of commencement of growth.

7 Claims, 4 Drawing Sheets

APPARATUS FOR GROWING HOLLOW CRYSTALLINE BODIES FROM THE MELT

This is a continuation of application Ser. No. 07/722,912, filed on Jun. 28, 1991, now abandoned which is a continuation in part of Ser. No. 07/550,482, filed on Jul. 10, 1990, now abandoned.

BACKGROUND OF THE INVENTION

This invention relates to the growth of monocrystalline bodies and more particularly to the production of monocrystalline closed-end structures such as domes.

Various methods have been developed for growing monocrystalline bodies from a melt. The present invention pertains to an improvement in growing crystalline bodies from a melt according to what is called the edge-defined, film-fed, growth technique (also known as the EFG process).

In earlier U.S. Pat. Nos. 3,915,662 (Labelle and Cronan) and 3,915,656 (Mlavsky and Pandiscio) techniques have been described for growing a closed end tube by the EFG method. Such tubes can be formed of numerous oxides by crystallizing the oxide, for example sapphire, from a columnar meniscus in contact with a wetted die surface under controlled growth conditions. Such closed end sapphire tubes can then be machined to form sapphire domes which are particularly useful in making electromagnetic domes. Some additional work has been described, for example, by Borodin et al "Journal Of Crystal Growth" 82 (1987) pages 89–84. This article shows hollow cones having rough interior and exterior shapes formed by a technique not fully described in the Borodin et al article. It may involve the technique described by Antonov etc., in Izvestia Akadimil Nauk SSR, Seriya Fizicheskay Vol. 49 No. 12 PP 2595-2292, 1985 wherein a growing tube is rotated over a wetted shaping element whose surface is smaller than the diameter of the tube. In the Antonov system only a small portion of the growing tube is adjacent the shaping element. Additionally, Labelle U.S. Pat. No. 3,846,082 describes a crystal growing technique where a small portion of a dome surface is formed by rotating a crystal partially around an axis of rotation above the wetted surface for which the crystal is grown. Labelle makes no effort to orient this crystal and the position of the axis substantially above the wetted surface prevents formation of a hemispherical dome.

SUMMARY OF THE INVENTION

It is the objective of the present invention to a closed end curved structure is formed from a crystalline sapphire melt, for example, by a modified EFG method. The radius of curvature of both the inner and outer surfaces of the curved shaped can be grown so as to quite closely approximate the final desired curved shapes of the two surfaces to minimize machining costs. The process also provides such a curved structure having a relatively thin wall, approximating the final desired thickness, and having a pure center section of the dome.

The present invention comprises a method and apparatus particularly adapted for growing a single crystal structure, preferably a dome. The dome is formed from a surface of revolution and is grown from a liquid melt. In a preferred form of the apparatus there is provided a supply of molten material and a curved linear die surface. This linear die surface is wetted by the molten material. A seed crystal is supported to rotate around an axis of revolution, this axis being preferably lying in the plane which contains the wetted surface. When the seed crystal initially contacts the wetted die surface, it starts the growth of a single crystal. As the seed crystal, with its growing single crystal, is moved upwardly and away from the wetted die surface, growth continues and, as the seed is rotated around an axis of revolution, the crystal grows as a thin wall with a curved surface having the axis of revolution as its center. If the linear die surface is also curved, preferably having the same radius of curvature as the radius of revolution of motion of the seed crystal, a spherical dome will be formed. But if the two radii are not the same, a curved aspherical surface will be created which, for some uses, may be a preferred form of the invention. However, the present invention will be initially described in the preferred form, wherein a spherical dome is formed. When the seed has traveled on the order of 180° of arc or more, depending upon the desired size of the spherical dome, the melt level is dropped to terminate the supply of material to the growing single crystal and the single crystal can then be removed from the apparatus. The seed crystal is initially supported in contact with a molten material in a predetermined orientation of one of its crystallographic axis with respect to the wetted surface. As the growing crystal is rotated around the axis of rotation, new crystal is growing from the melt to form the complex curved surface. However, the crystal's axis remains fixed with respect to the crystal support and seed crystal, and the orientation of the crystal axis at the wetted surface also remains aligned with the crystal axis of the seed crystal during this growth. Accordingly, the axis of the crystal at the die surface, changes with respect to the die as the curved surface is growing. The crystal growth is continued until the orientation of the crystal axis is in a predetermined relation to a predetermined portion, e.g. the apex of said complex curved surface; thereafter the growth can be terminated and the dome can be ground to final shape.

In order to more fully understand the invention, reference should be had to the following drawings taken in connection with the attached specification wherein:

DETAILED DESCRIPTION OF THE INVENTION

Figure 1:
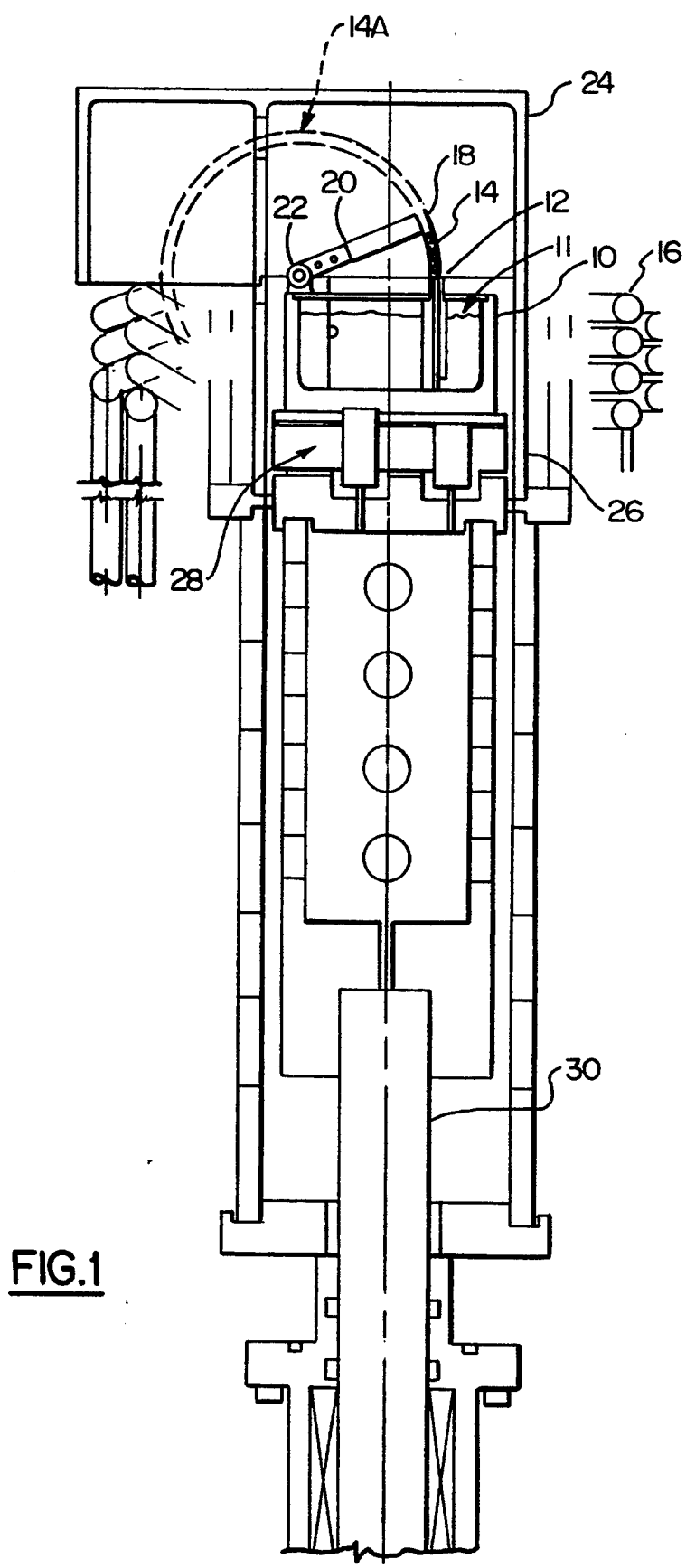
FIG. 1 is diagrammatic sectional view of the furnace and crystal growing apparatus.
Figure 2:
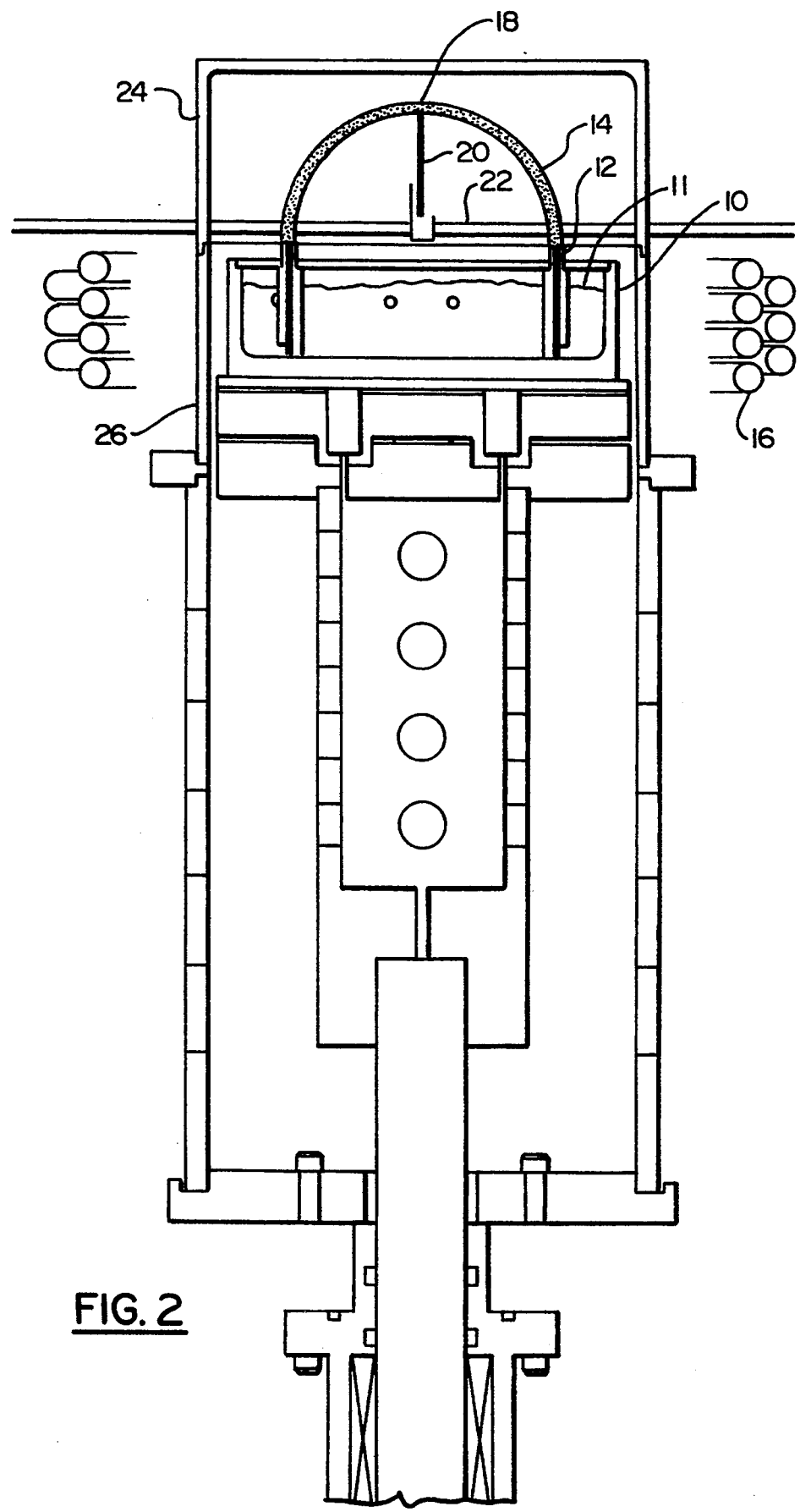
FIG. 2 is a view similar to FIG. 1, but taken along the sectional line 2—2.

Referring now to FIGS. 1 and 2, there is generally shown a crucible 10 for containing molten material 11 to be crystallized from the surface of a die 12. The forming crystalline spherical body is indicated at 14 as growing from the seed 18 carried by an arm 20 mounted on a shaft 22. The crucible is preferably heated by a standard induction coil 16, the furnace being the standard crystal growing type of furnace used in EFG crystal growth. The path of movement of the seed is shown as an arc 14A, which, as it moves, draws behind it a spherical monocrystal 14. As shown, the axis of rotation of the shaft 22 is coplanar with the top of the die surface 12. Thus, the curved die 12, the surface of seed 18 and the shaft 22 are all coplanar at the start of crystal growth.

The crystal growing area is surrounded by suitable standard heat shields 24 which permit a controlled cooling rate for the growing crystal. This shield 24 is an extension of the lower section of the furnace housing 26. A support 28 for the crucible 10 is carried by a shaft 30 which can be used to control the position of the crucible 10 with respect to the other elements in the furnace. When the crystal dome has been grown to a sufficiently large size, a preferred method of terminating growth is to drop the crucible, supporting the die 12, thus breaking the meniscus between the growing crystal 14 and the wetted surface 12 of the die. After cooling, the formed spherical single crystal can then be removed.

Figure 3:
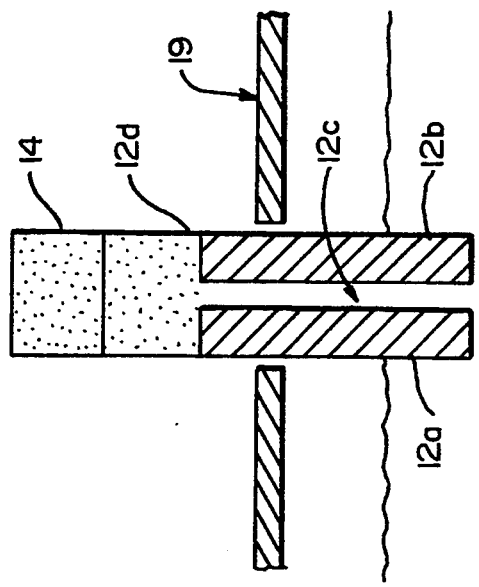
FIG. 3 is an enlarged plan view showing the details of the die surface.

Referring now to FIG. 3, the curved shape 12A of the die 12 is illustrated in plan view. If this curved shape is an arc of a circle and it is rotated about an axis having a radius equal to the radius of the circle a perfect spherical surface will be formed. If either of these axes is different from the other, the resulting surface will be something other than a portion of a sphere.

Figure 4:
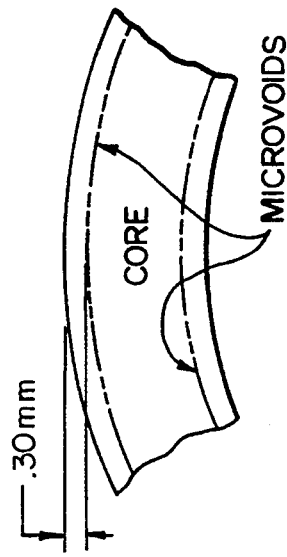
FIG. 4 is an enlarged sectional view of the die structure.

Referring now to FIGS. 3 and 4, the structure of die 12 is set forth in greater detail. This die 12 is preferably formed of a metal, such as molybdenum, which is readily wetted by the material (such as sapphire) to be grown as a single crystal. In one preferred form, the die 12 is formed of two semicylinders 12a and 12b which are concentrically mounted with a small 0.9 mm spacing therebetween to provide a capillary slot 12c for feeding molten sapphire from the supply 11 to the top 12d of the die 12 which defines the EFG crystal growth surface. A cover 19 is provided over the supply 11 of molten sapphire to control radiant heat loss.

In one preferred embodiment of the invention, the crucible is D shaped, the long and short axes of which are 4.3 and 2.3 inches respectively and is made of molybdenum or tungsten filled with 125 grams of high purity aluminum oxide($Al_2O_3$) to start the crystal growing. The charge of sapphire in the crucible is raised to a temperature of at least 2050° C. (which is the approximate melting point of $Al_2O_3$), at which temperature it will wet the die 12. The die 12 is preferably formed of molybdenum or tungsten to form a surface wetted by molten aluminum oxide. A seed crystal 18 of single crystal sapphire is mounted on the end of the arm 20. The seed crystal preferably has at least 120° of arc in contact with the wetted surface. The seed crystal 18 is preferably of identical material to the crystal to be formed and is oriented so that the C <0001> or optical axis is perpendicular with respect to the die surface.

Figure 8:
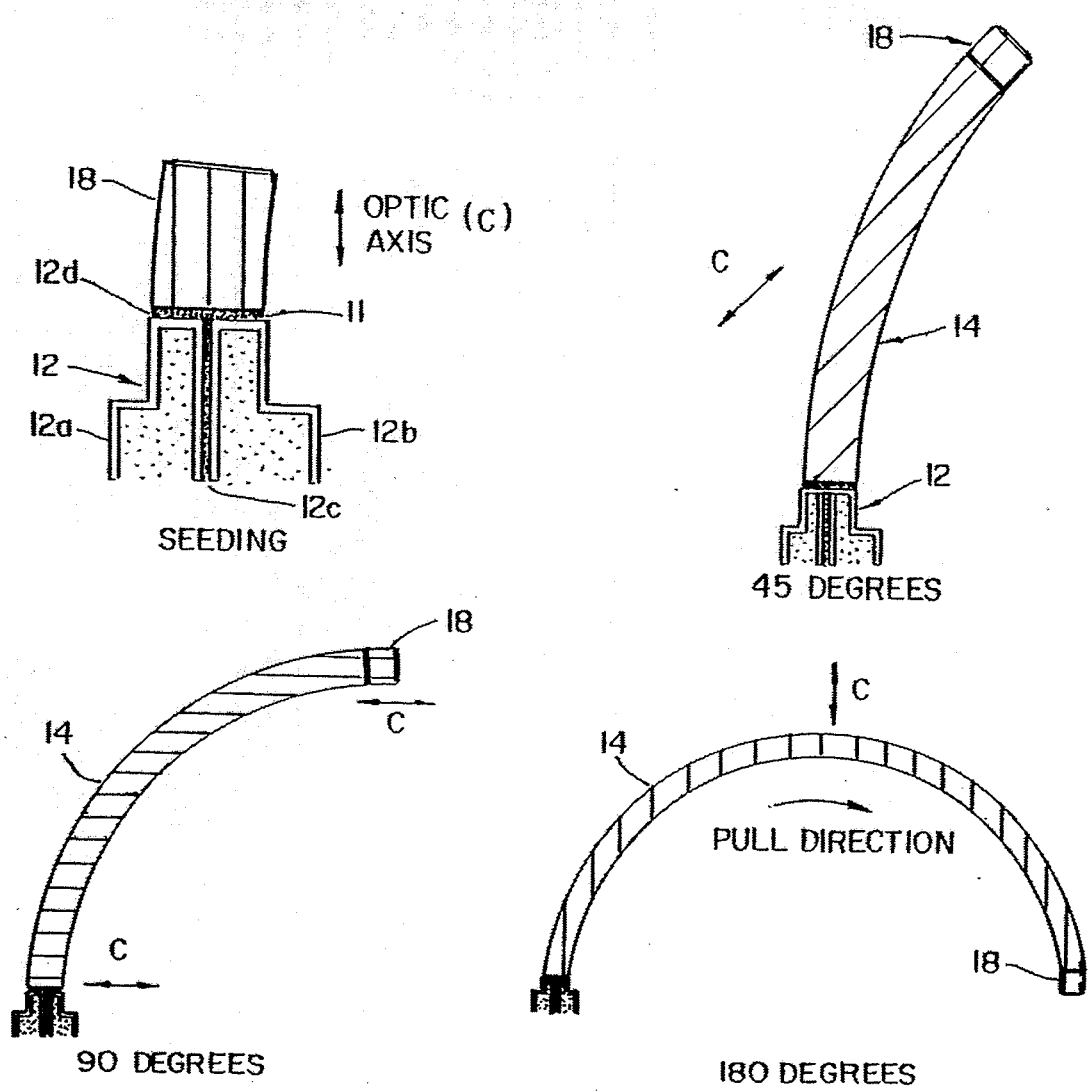
FIG. 8 shows the positions of the optic axis (c-axis) in the grown crystal as a seed crystal is rotated around the axis.

By referring to FIG. 8, one can visualize the gradual and constant changing of the optic axis in the growing crystal as the seed crystal is rotated around the axis of revolution. As can be seen, the axis starts perpendicular to the wetted surface and gradually moves (at 90°) parallel to the wetted surface and at 180° of rotation, it is again perpendicular to the wetted surface. In this way, the radius of the apex of the dome will be parallel to the C direction. The seed crystal 18 of sapphire on the end of the arm 20 is then rotated down into contact with the top wetted surface of the die 12. With wetting of the seed, the arm 20 is slowly rotated so that the seed crystal travels away from the die at about 45 degrees of arc per hour. Since the inner and outer edges of the crystal wall 14 are defined by the inner and outer edges of die 12, the wall thickness of the dome remains substantially constant even though those portions of the surface closest to the axis of revolution are grown at a rate substantially less than the rate of growth of those portions farthest from the axis of revolution. When the arm has rotated through 180-200 degrees of arc, further rotation is stopped, the crucible is lowered a few millimeters to break the meniscus between the grown spherical body and the wetted surface on the die 12. This is then cooled to room temperature and removed.

Figure 5:
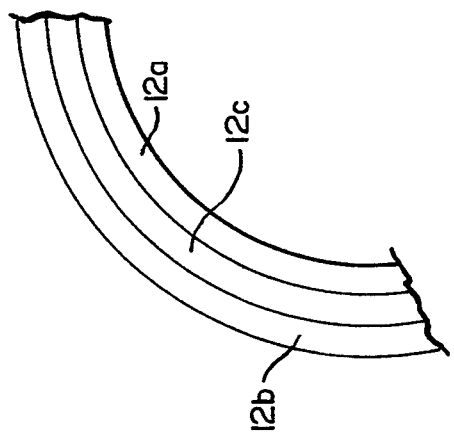
FIG. 5 is a graph showing the dimensions of a preferred type of dome grown on accordance with the present invention.

Referring now to FIG. 5, the dimensions of a preferred type of dome grown in accordance with the present invention are shown. Overall, the dome has a spherical radius of 38 mm and chord length of 74.5 mm. Intermediate measurements taken, for example, at a dome height of 9.5 mm and cord length of 41 mm confirm the spherical shape of the dome.

While one preferred embodiment has been described above, numerous modifications may be made without departing from the spirit of the invention. For example, the crystalline material can be another oxide such as MgO or can be a pure element such as silicon, germanium and the like. Similarly, the shape of the die surface which controls the initial shape of the growing single crystal can be modified to get a predetermined final crystal form. For example, if the initial die shape 12 is a straight line, the resultant product can be a portion of a cylindrical surface. Many other shapes are possible, particularly if the axis of revolution is shifted, in a predetermined fashion, during crystal growth to change the location of the center of curvature of the forming shaped crystal. Such a shifting can be accomplished by means of a cam, for example.

While the seed is illustrated as being a relatively small section of arc, (for ease of illustration) it can be a relatively long curved portion, up to 180° of arc. As mentioned previously, it is preferred that the seed crystal extend over at least 120° of arc. Also, a pressure feed to the die surface 12d can be employed to replace or supplement the capillary feed.

As will be apparent, the growth of different portions of the crystal dome is at different rates, depending upon the distance of the growth surface from the center of curvature. However, the EFG die surface 12d will control the thickness of the dome 14 over a large range of crystal growth rates. The as-grown dome will have a thickness variation of less than 10%, often less than 2%.

Since scattered light is an important feature of dome performance, measurements were made both on two polished domes made in accordance with the present invention and on flat witness samples produced by the EFG process. The domes were measured on axis and in rings symmetric with the axis at 5°, 10°, 15° and 20° from the axis (61 points) and the flat pieces at intervals of 0.080" out to a 0.32Δradius from the center (also 61 points) at wavelengths of both 0.6326 um in the visible region of the spectrum and 3.39 um in the infrared region. In every case the scatter increased away from the center of the piece. Results are given in Table I. In the case of the domes, the scattered light was in the mid $10^{-3}$ range in the visible and decreased by a factor of 3 to 4 from that value in the infrared. If the scatter had been caused by surface microroughness alone, the predicted decrease in scattered light would have been a factor of 29 times. Some of the scattered light is thus from isolated larger scattering centers, some of them probably in the bulk of the material. In the case of the second flat sample, bulk scattering was very evident. The scattering level actually increased at the longer wavelength, and under a microscope small cubical inclusions could be seen. They are precipitated molybdenum crystals, and their occurrence can be controlled, as shown by the other samples. The two flat samples are the same thickness and have nearly identical surface finishes, leading to the conclusion that these bulk scattering centers increase the scattered light level in this case by nearly an order of magnitude.

A comparison of the scattered light levels found for these domes with typical values previously reported for other types of domes is given in Table I. Values for the other materials were taken from references A and B, and are the best ones reported. (Ref A. - P.C. Archibald and D. K. Burge, "Optical measurements on advanced performance domes," SPIE Vol. 505, Advances in Optical Materials, pp. 52-56, 1984)(Ref. B. - P. C. Archibald and H. E. Bennett, "Scattering from Infrared Missle Domes," Optical Engineering, Vol. 17 No. 6 pp. 647-651, 1978). By far the lowest scattering level was measured for the sapphire dome produced by an alternate technique which involved cutting, grinding and polishing a dome from a solid ingot of single crystal sapphire. This extremely high quality dome illustrates what is achievable with this material. Sapphire is extremely hard and some of the lowest surface scattering levels yet reported have been measured on this material.

EFG Flat #1 has a scattering level which approaches that measured on the high quality dome, suggesting that the EFG process is capable of producing material whose surface can be polished to extremely low roughnesses. its infrared value is 5 times higher than that of highest quality sapphire dome, probably because of higher volume scatter in the material. It is still lower than IRTRAN I, the standard infrared dome material, by over a factor of 20. The EFG domes produced so far are higher than that of the best EFG flat sample by factors of 3 to 9 in the infrared region. They are still better than IRTRAN I. It is important to remember that these pieces represent an interim step in the experimental process. Neither the crystal growth nor the final finishing had been optimized. Nevertheless, in both the visible and infrared regions they have lower scatter than any of the other materials reported. A scattering level in the $10^{-3}$ range in the visible or infrared regions is quite acceptable for most missile applications.

Figure 6:
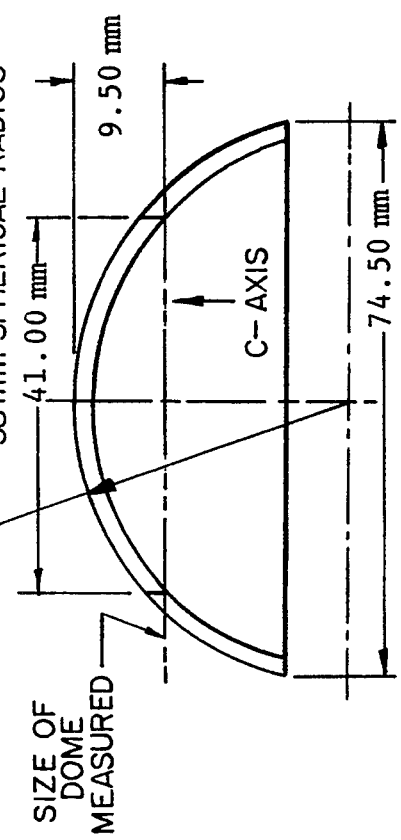
FIG. 6 shows the schematic of the bulk inclusions in the as grown crystal dome.

The first characteristic of the as-grown crystal visible to the eye is the presence of surface features. These can be of two basic categories: die marks and growth artifacts. The first are simply blemishes left by the imperfect edge of the die while the second are a function of growth parameters such as pull speed and temperature. Just below (0.25 mm) the surface is a layer of fine bubbles termed micro-voids. The mechanism of micro-void formation is not well understood, but is thought to be caused by impurity driven constitutional supercooling at the interface. Fortunately, both these imperfections lie within this 0.25 to 0.30 mm surface layer and are the first to be ground off, leaving behind a much higher quality middle region. FIG. 6 is a schematic of the relative position of the micro-voids within the blank.

Figure 7:
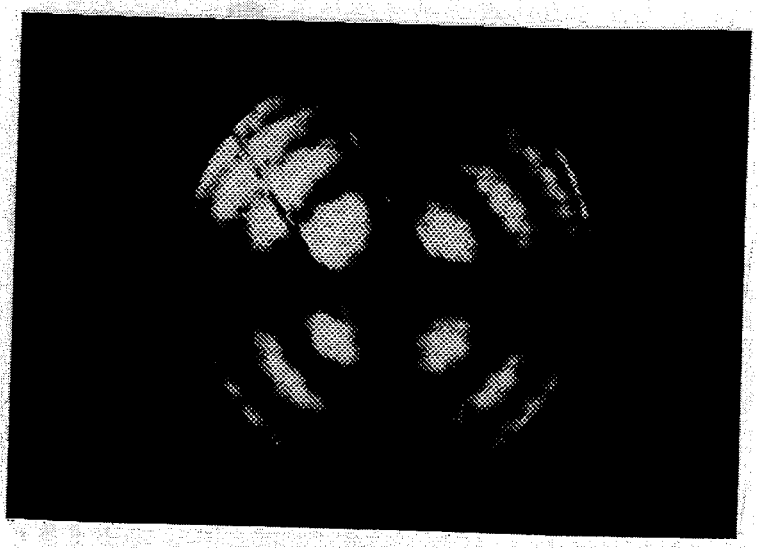
FIG. 7 is a photograph of the dome showing the uniaxial cross, the interference figure, indicating an optic axis direction in the grown sapphire dome.

Another important factor to take into account is the inherent anisotropy of sapphire with respect to most of its physical properties, and most importantly for this application, the orientation of the dome be exactly on the optic axis. FIG. 7 shows how the apex of the piece under study is in fact on the optic axis. The photograph was taken through a polariscope. FIG. 7 also reveals a few low angle grain boundaries whose effect on optical performance has not been studied. Their occurrence have been observed to be related to growth parameters and orientation.

The measurement of total integrated scatter (TIS) is accepted as a means to evaluate dome from both a bulk material as well as a surface finish perspective. Table 1 compiles present results and compares them to state-of-the-art for alternate materials. Values for the other materials were taken from references A and B. The apparatus for the optical measurements is described in Archibald and Bennett (1978).

TABLE 1

Total Integrated Scatter Results

| Dome Material | Wavelength [uM] | | |
|---|---|---|---|
| | 0.6328 | 0.6471 | 3.39 |
| EFG Dome #1 | .00768 | — | .00241 |
| EFG Dome #2 | .00410 | — | .000952 |
| EFG Dome #1 center | .00260 | — | .000550 |
| EFG Flat #1 | .000473 | — | .000280 |
| EFG Flat #2 | .00597 | — | .00854 |
| EFG Flat #1 center | .000390 | — | .000150 |
| Other Sapphire Dome | — | .000267 | <.00005 |
| MgF$_2$ | — | — | .0134 |
| Irtran-1 | — | — | .00583 |
| ALON | — | .0278 | .0136 |
| Spinel[5] | — | .0112 | .0021 |

As previously mentioned the TIS technique is a good measure of bulk properties as well. This is evidenced by the difference noted between EFG flat samples #1 and #2. Upon further inspection it was found that sample #2 was full of precipitated molybdenum crystallites. Since the two pieces have nearly identical surface finishes these bulk inclusions appear to make more than an order of magnitude difference.

What is claimed is

1. An Apparatus for growing a single crystal sapphire dome of required radius of curvature, wherein said dome is formed from a surface of revolution which is grown from a liquid material, said apparatus comprising a supply of said molten material, a curved linear die surface wettable by said molten material, an axis of revolution, means for supporting a seed crystal in a position spaced from said axis of revolution by an amount equal to said radius, means for rotating said seed crystal around said axis of revolution to generate a curved surface having said radius of curvature, the improvement wherein the axis of revolution of said seed rotating means lies in a horizontal plane coincident with said wetted surface and said seed crystal is in the form of a curved shape which extends through at least 120° of arc.

2. The apparatus of claim 1 wherein said linear die surface is curved around a second axis of revolution to provide a second curved surface and the radius of curvature of said second curved surface is substantially equal to the spacing of seed from said axis whereby said surface of revolution is a portion of a sphere.

3. The apparatus of claim 1 wherein said means for supporting said seed crystal is arranged to position said crystal at the commencement of crystal growth so that the C, or optic, axis is normal to the plane of the wetted surface.

4. The apparatus of claim 1 wherein said apparatus includes means for lowering said die surface with respect to a grown crystal dome to break a liquid meniscus between the die surface and the crystal.

5. The apparatus of claim 1 wherein said die surface is formed of two concentric pieces of metal spaced on the order of 0.9 mm apart.

6. Method for growing a single crystal sapphire dome having a surface of revolution of required radius of curvature and wherein said dome is grown from a liquid material, comprising supplying said molten material to a curved linear die surface wettable by said molten material, supporting a seed crystal in contact with molten material on said wetted surface and in a position spaced from an axis of revolution lying in a horizontal plane coincident with said wetted surface, said seed crystal extending through at least 120° of arc, rotating said seed crystal around said axis of revolution to generate a curved surface having said required radius of curvature.

7. The method of claim 6 wherein the curved surface produced by rotation of the seed crystal has the same radius of curvature as that of the seed crystal.

* * * * *